US007974053B2

(12) United States Patent
Ker et al.

(10) Patent No.: US 7,974,053 B2
(45) Date of Patent: Jul. 5, 2011

(54) ESD PROTECTION CIRCUIT FOR DIFFERENTIAL I/O PAIR

(75) Inventors: Ming-Dou Ker, Hsinchu County (TW); Yuan-Wen Hsiao, Taichung (TW); Hsin-Chin Jiang, Taipei (TW)

(73) Assignee: Amazing Microelectronic Corp, Jhonghe (TW)

( * ) Notice: Subject to any disclaimer, the term of this patent is extended or adjusted under 35 U.S.C. 154(b) by 651 days.

(21) Appl. No.: 12/129,230

(22) Filed: May 29, 2008

(65) Prior Publication Data

US 2009/0296293 A1 Dec. 3, 2009

(51) Int. Cl.

*H02H 9/00* (2006.01)
*H02H 3/20* (2006.01)
*H02H 9/04* (2006.01)

(52) U.S. Cl. .......................... 361/56; 361/91.1; 361/111

(58) Field of Classification Search .................... 361/56, 361/91.1, 111

See application file for complete search history.

(56) References Cited

U.S. PATENT DOCUMENTS 5,862,031 A * 1/1999 Wicker et al. ................. 361/111
6,385,116 B2 * 5/2002 Wang ............................ 365/226
6,507,471 B2 * 1/2003 Colclaser et al. ............. 361/111
6,690,557 B2 * 2/2004 Hung et al. ..................... 361/56
6,693,780 B2 * 2/2004 Spehar et al. ................... 361/56
6,731,488 B2 * 5/2004 Voldman ........................ 361/111
6,882,224 B1 * 4/2005 Gaboury et al. .............. 330/253
7,579,881 B2 * 8/2009 Bach ............................. 327/108
7,880,195 B2 * 2/2011 Ker et al. ...................... 257/173
2003/0076636 A1 * 4/2003 Ker et al. ........................ 361/56
2006/0132996 A1 * 6/2006 Poulton ........................... 361/56

OTHER PUBLICATIONS

Ker, M.-D et al., "ESD protection design on analog pin with very low input capacitance for high-frequency or current-mode applications," Aug. 2000, pp. 1194-1199, vol. 35, No. 8, IEEE J. Solid-State Circuits.

* cited by examiner

*Primary Examiner* — Jared J Fureman
*Assistant Examiner* — Christopher J Clark
(74) *Attorney, Agent, or Firm* — Tim Tingkang Xia; Morris, Manning & Martin, LLP

(57) ABSTRACT

An ESD protection circuit for a differential I/O pair is provided. The circuit includes an ESD detection circuit, a discharge device, and four diodes. The first diode is coupled between the first I/O pin and the discharge device in a forward direction toward the discharge device. The second diode is coupled between the second I/O pin and the discharge device in a forward direction toward the second I/O pin. The third diode is coupled between the discharge device and the positive power line in a forward direction toward the positive power line. The fourth diode is coupled between the discharge device and the negative power line in a forward direction toward the discharge device. Via an output end, the ESD detection circuit triggers the discharge device during ESD events.

20 Claims, 16 Drawing Sheets

VDD
Load Circuit
70
58
50
A
52
D5
D1
D3
$V_{ESD}$
+V
0V
56
Discharge Device
Power-Rail ESD Clamp Circuit
54
$I_{ESD}$
M1
M2
D2
D4
$I_{ESD}$
B
60
D6
VSS (A)

(B)

(C)

(D)

(E)

(F)

(G)

(H)

ESD PROTECTION CIRCUIT FOR DIFFERENTIAL I/O PAIR

BACKGROUND OF THE INVENTION

1. Field of the Invention

The present invention is related to an electrostatic discharge (ESD) protection circuit. In particular, the present invention relates to an ESD protection circuit for differential pairs.

2. Description of the Prior Art

ESD is one of the most important reliability issues for integrated circuit (IC) products and must be taken into consideration during the design phase of all ICs. ESD events can be classified in to several modes: PS-mode, ND-mode, PD-mode, NS-mode, and pin-to-pin mode.

Under positive-to-VSS (PS-mode) ESD stresses, a positive ESD zapping is applied to an input pad while the VSS power rail is grounded and the VDD power rail is floating. Under negative-to-VDD (ND-mode) ESD stresses, a negative ESD zapping is applied to an input pad while the VDD power rail is grounded and the VSS power rail is floating. Under positive-to-VDD (PD-mode) ESD stresses, a positive ESD zapping is applied to an input pad while the VDD power rail is grounded and the VSS power rail is floating. Under negative-to-VSS (NS-mode) ESD stresses, a negative ESD zapping is applied to an input pad while the VSS power rail is grounded and the VDD power rail is floating.

Recently, more and more high-speed communication circuits and radio-frequency (RF) frond-end circuits are realized with differential input/output stages because differential configuration can suppress impacts caused by common-mode interferences. However, differential I/O pairs are especially susceptible to pin-to-pin ESD attacks. In a pin-to-pin ESD event, ESD voltage is stressed on one pin of the differential I/O pair while the other pin is grounded. If the ESD voltage across the differential pair cannot be eliminated effectively, the device undertaken the ESD voltage (e.g. gate of a MOSFET) will be damaged.

FIG. 1 shows an ESD protection circuit for differential I/O pairs disclosed in "ESD protection design on analog pin with very low input capacitance for high-frequency or current-mode applications" reported by M.-D. Ker, T.-Y. Chen, C.-Y. Wu, and H.-H. Chang on IEEE J. Solid-State Circuits, vol. 35, no. 8, pp. 1194-1199, August 2000. This protection circuit includes gate-VDD PMOSs (Mp1, Mp2), gate-grounded NMOSs (Mn1, Mn2), and a power-rail ESD clamp circuit 10.

As shown in FIG. 1, a differential input stage 12 is respectively connected to a first input pad 14 and a second input pad 16. Once an ESD voltage is stressed on the first input pad 14 while the second input pad 16 is grounded, ESD currents will flow to ground through the PMOS Mp1, power-rail ESD clamp device 10 (from VDD to VSS), NMOS Mn2, and finally to the second input pad 16.

The ESD protection configuration in the above prior art has a disadvantage. Because the ESD clamp circuit 10 is typically located far from the differential input stage 12 in actual layout, the parasitic resistance on metal lines between the ESD clamp circuit 10 and the differential input stage 12 might not be small. Since ESD currents are generally large, the cross voltage induced by the parasitic resistance cannot be ignored. In other words, the ESD voltage across the I/O pairs of the differential input stage 12 still might damage the input components.

FIG. 2 illustrates another traditional ESD protection circuit for differential I/O pairs. In this configuration, each input pad (24, 26) of the differential input stage 22 is coupled with two diodes (D1~D4); one diode is connected between VDD and the input pad, and the other diode is connected between the input pad and VSS. Once an ESD voltage is stressed on the first input pad 24 while the second input pad 26 is grounded, ESD currents will flow to ground through the diode D1, power-rail ESD clamp device 20 (from VDD to VSS), diode D4, and finally to the second input pad 26. Similarly, the ESD clamp circuit 20 is generally located far from the differential input stage 22, and large parasitic resistance between them may also induce the problem above.

To solve the aforementioned problem, clamp devices configured more directly between two inputs of the differential pair is utilized. FIG. 3 illustrates an ESD protection circuit disclosed in the U.S. Pat. No. 6,507,471. The differential input stage includes two input devices (Q1, Q2) and three resistors (RE, RL1, RL2). As shown in FIG. 3, an NMOS Q3 is connected between the differential input pads (34, 36).

Diodes D1~D4 and a power-rail ESD clamp circuit 30 are used to protect the differential pair (34, 36) against PS-mode, PD-mode, NS-mode, and ND-mode ESD stresses. Under pin-to-pin ESD stresses, one differential input pad is zapped by ESD while the other differential input pad is relatively grounded. When a pin-to-pin ESD occurs, the NMOS Q3 will be turned on to provide ESD current path between the differential input pads.

FIG. 4 illustrates another ESD protection circuit disclosed in the U.S. Pat. No. 6,693,780. In this configuration, four diodes (D5~D8) are connected between the differential input pads (44, 46) to provide ESD current path under pin-to-pin ESD stresses. Besides, diodes D9 and D10 are applied to provide ESD protection against pin-to-pin ESD stresses. When input pad 44 is zapped by ESD with input pad 46 grounded, the diodes D5 and D6 will be forward biased to bypass ESD currents. Moreover, the base-emitter junction of Q1 and diode D10 can provide another ESD current path to protect the differential pair against pin-to-pin ESD stresses.

SUMMARY OF THE INVENTION

The scope of the invention is to provide new ESD protection circuits for differential pairs. One embodiment according to the invention is an ESD protection circuit for a differential I/O pair including a first I/O pin and a second I/O pin. The ESD protection circuit includes an ESD detection circuit, a discharge device, and four diodes. A first diode is coupled between the first I/O pin and the discharge device in a forward direction toward the discharge device. A second diode is coupled between the second I/O pin and the discharge device in a forward direction toward the second I/O pin. The ESD detection circuit has a positive power end coupled to a positive power line, a negative power end coupled to a negative power line, and an output end coupled to a triggering end of the discharge device. A third diode is coupled between the discharge device and the positive power line in a forward direction toward the positive power line. A fourth diode is coupled between the discharge device and the negative power line in a forward direction toward the discharge device. Via the output end, the ESD detection circuit triggers the discharge device during ESD events.

The advantage and spirit of the invention may be understood by the following recitations together with the appended drawings.

BRIEF DESCRIPTION OF THE APPENDED DRAWINGS

FIG. 1~FIG. 4 illustrate several ESD protection circuits for differential I/O pairs in prior arts.

FIG. 7~FIG. 29 illustrate exemplary alterations of the first embodiment according to the invention.

DETAILED DESCRIPTION OF THE INVENTION

Figure 1:
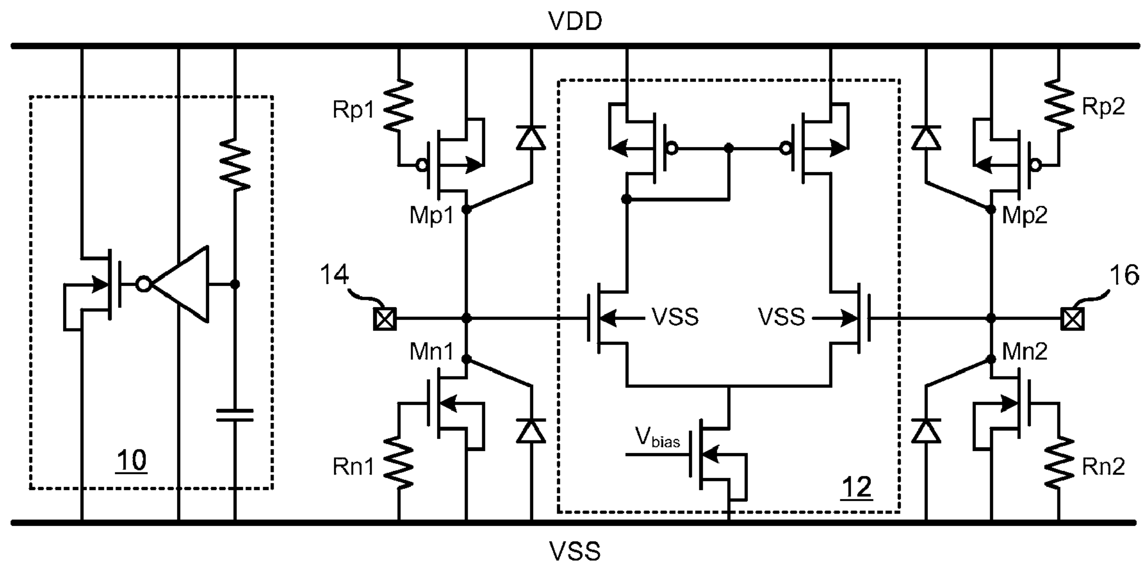
Figure 2:
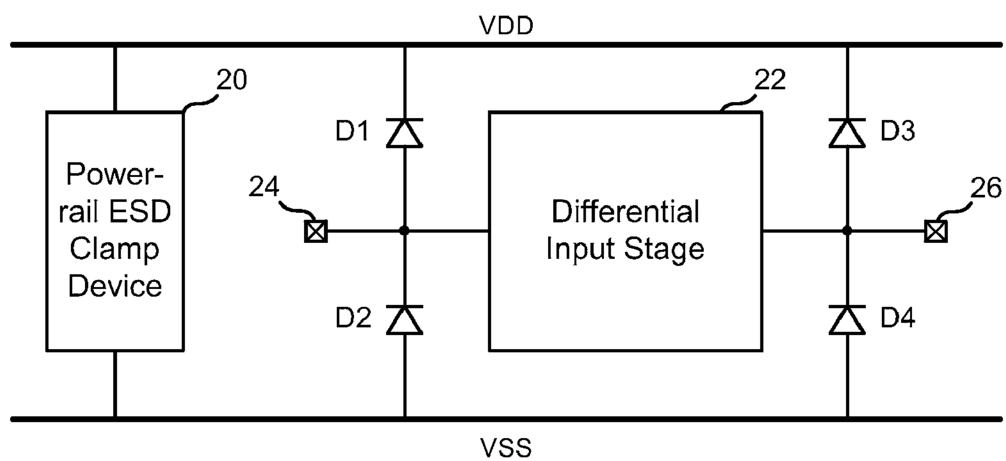
Figure 3:
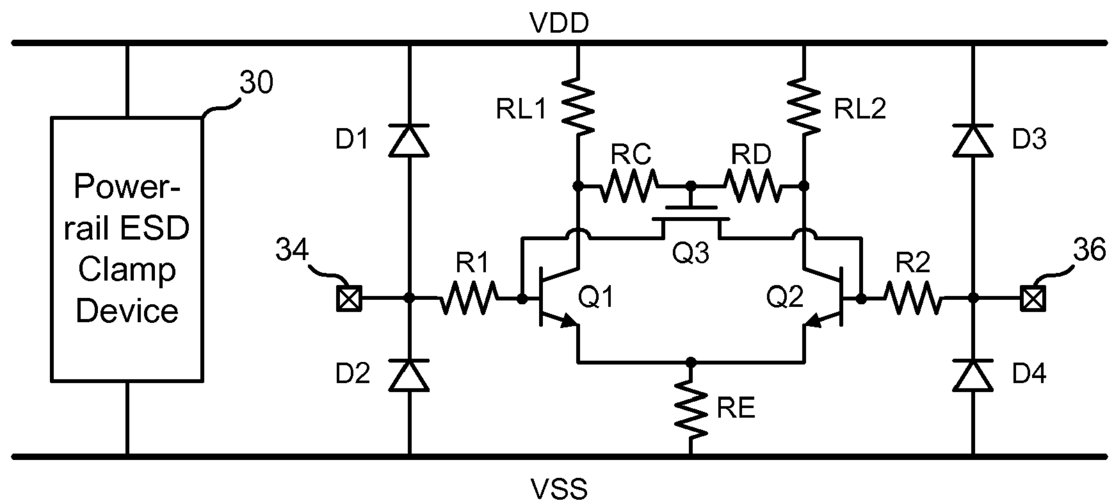
Figure 4:
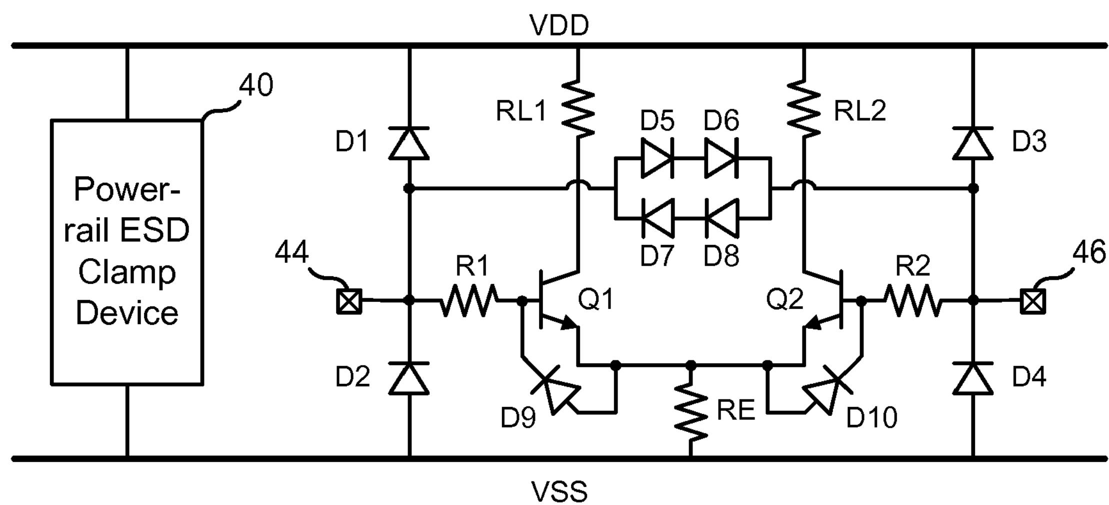
Figure 5:
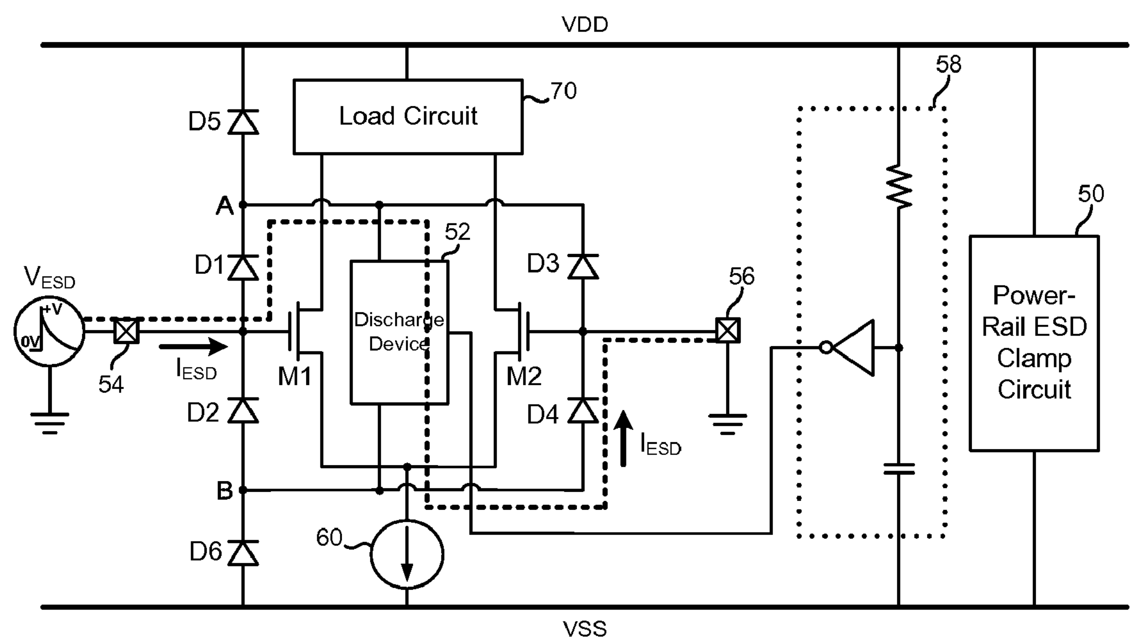
FIG. 5 illustrates the ESD protection circuit in the first embodiment according to the invention.

Please refer to FIG. 5, which illustrates the ESD protection circuit in the first embodiment according to the invention. The ESD protection circuit is used for protecting a differential input stage including two input components (M1, M2), a current source 60, and a load circuit 70. The input component M1 is connected to a first input pin 54, and the input component M2 is connected to a second input pin 56.

As shown in FIG. 5, a diode D1 is connected between the first input pin 54 and a node A in a forward direction toward node A, and a diode D2 is connected between the first input pin 54 and a node B in a forward direction toward the first input pin 54. Symmetrically, a diode D3 is connected between the second input pin 56 and node A in a forward direction toward node A, and a diode D4 is connected between the second input pin 56 and node B in a forward direction toward the second input pin 56.

Further, a diode D5 is connected between node A and VDD, a diode D6 is connected between node B and VSS. An ESD detection circuit 58 has a positive power end coupled to VDD, a negative power end coupled to VSS, and an output end coupled to a discharge device 52. A power-rail ESD clamp circuit 50 is also connected between VDD and VSS.

As indicated by the ESD voltage source ($V_{ESD}$) connected to the first input pin 54, the following descriptions will take the condition that an ESD zapping is applied to the first input pin 54 as a main example. The condition that an ESD zapping is applied to the second input pin 56 can accordingly be analogized because the two sides of a differential pair are symmetric.

When a PS-mode ESD event occurs, a positive ESD zapping is applied to the first input pin 54 while VSS is grounded and VDD is floating. Under this condition, ESD currents will flow from the first input pin 54, through the diodes D1, D5, the VDD power line, the ESD clamp circuit 50, and finally to VSS. When an ND-mode ESD event occurs, a negative ESD zapping is applied to the first input pin 54 while VDD is grounded and VSS is floating. Under this condition, ESD currents will flow from VDD, through the ESD clamp circuit 50, the diodes D6, D2, and finally to the first input pin 54.

When a PD-mode ESD event occurs, a positive ESD zapping is applied to the first input pin 54 while VDD is grounded and VSS is floating. Under this condition, ESD currents will flow from the first input pin 54, through the diodes D1, D5, and finally to VDD. When an NS-mode ESD event occurs, a negative ESD zapping is applied to the first input pin 54 while VSS is grounded and VDD is floating. Under this condition, ESD currents will flow from VSS, through the diodes D6, D2, and finally to the first input pin 54.

During normal power operations, the ESD detection circuit 58 is configured to turn off the discharge device 52 coupled between node A and node B. Once a pin-to-pin ESD event occurs, a positive ESD zapping is applied to the first input pin 54 while the second input pin 56 is grounded. Under this condition, the ESD voltage is first coupled from the first input pin 54 to VDD through the diodes D1 and D5. Subsequently, the ESD detection circuit 58 is enabled to provide a trigger signal for the discharge device 52.

After being triggered, the discharge device 52 is turned on and conducts ESD currents from node A to node B. The ESD current can then flow to the ground through the diode D4 and the second input pin 56. More specifically, as indicated by the dashed line in FIG. 5, ESD currents ($I_{ESD}$) will sequentially flow through the first input pin 54, the diode D1, node A, the discharge device 52, node B, the diode D4, and the second input pin 56. Thereby, the cross voltage formed between the first input pin 54 and the second input pin 56 is the summation of the on-voltages of D1, D4, and the discharge device 52. As long as this cross voltage is properly designed, the input component M1 can be protected from being damaged by ESD stresses.

Similarly, once a positive ESD zapping is applied to the second input pin 56 while the first input pin 54 is grounded, the ESD voltage is coupled from the second input pin 56 to VDD through the diodes D3 and D5. The ESD detection circuit 58 will accordingly be enabled to trigger the discharge device 52. ESD currents will then sequentially flow through the second input pin 56, the diode D3, node A, the discharge device 52, node B, the diode D2, and the first input pin 54. Thereby, the input component M2 is protected from being damaged by the ESD stress.

Figure 6:
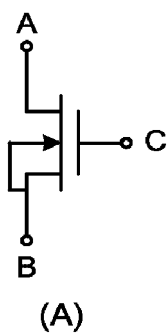
FIG. 6 illustrates several applicable examples of the discharge device coupled between node A and node B.
Figure 6:
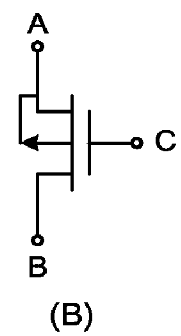
Figure 6:
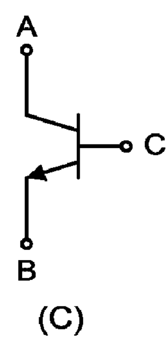
Figure 6:
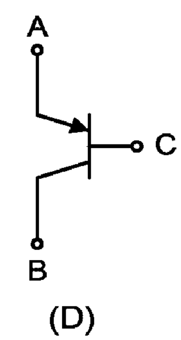
Figure 6:
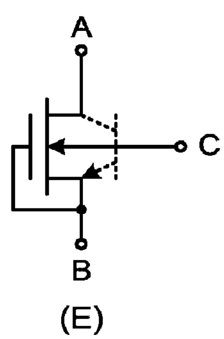
Figure 6:
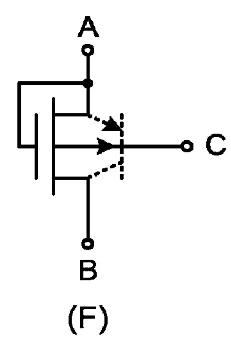
Figure 6:
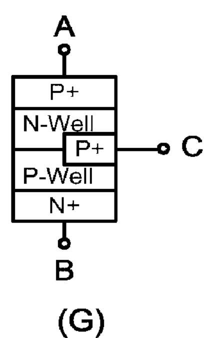
Figure 6:
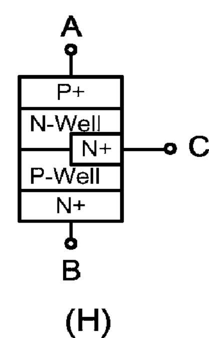

In actual application, the discharge device 52 can be a gate-driven NMOS in FIG. 6(A), a gate-driven PMOS in FIG. 6(B), an NPN BJT in FIG. 6(C), a PNP BJT in FIG. 6(D), an NMOS with its gate and source coupled together in FIG. 6(E), a PMOS with its gate and source coupled together in FIG. 6(F), a P-type substrate-triggered SCR (P-STSCR) in FIG. 6(G), or an N-type substrate-triggered SCR (N-STSCR) in FIG. 6(H). The node labeled as C in FIG. 6 represents the triggering end of the discharge device 52 that is connected to the ESD detection circuit 58.

Further, the detailed schematic of the ESD detection circuit 58 can have lots of variations. For instance, the ESD detection circuit 58, as shown in FIG. 5, can simply consist of a resistor, a capacitor, and an inverter. As long as being capable of providing the function of turning the discharge device 52 off during normal power operations and triggering the discharge device 52 during an ESD event, the detailed embodiment of the ESD detection circuit 58 is not limited.

It can be seen that the ESD protection configuration shown in FIG. 5 can protect the differential input stage against all ESD modes, including pin-to-pin ESD stresses. In other embodiments according to the invention, the above ESD protection circuit can be altered without affecting its functionality. Some exemplary embodiments are described below and shown in FIG. 7 through FIG. 29.

Figure 7:
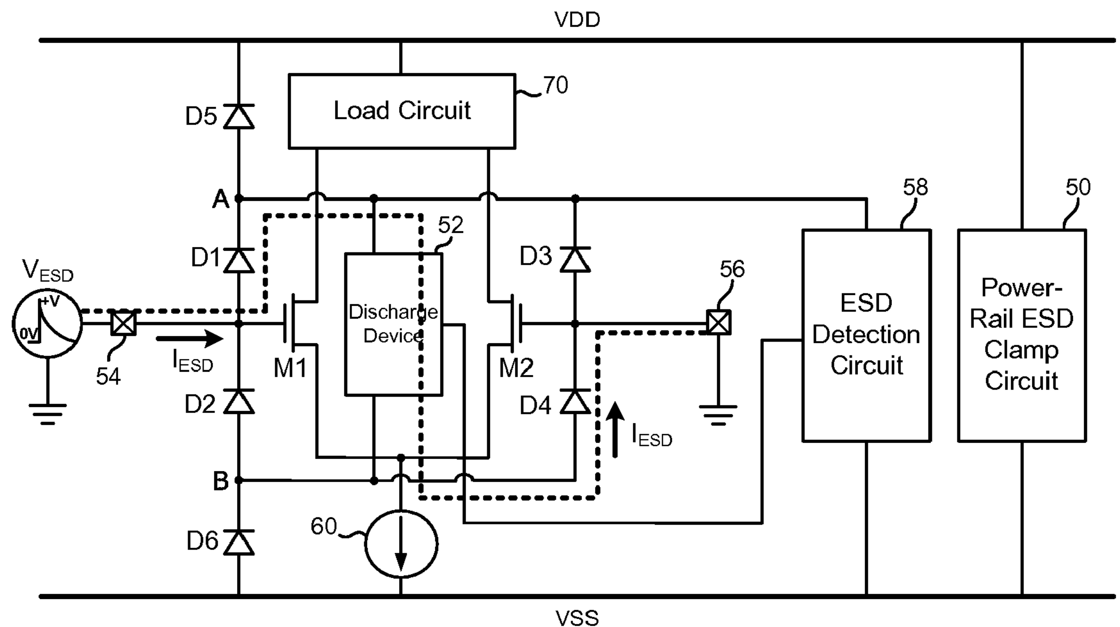

In the embodiment shown in FIG. 7, the positive power end of the ESD detection circuit 58 is connected to node A instead of VDD. Since the voltage at node A is close to the voltage at VDD when one of the input pins is zapped by ESD stresses, the voltage at node A is high enough to enable the ESD detection circuit 58 to provide the trigger signal for the discharge device 52.

Figure 8:
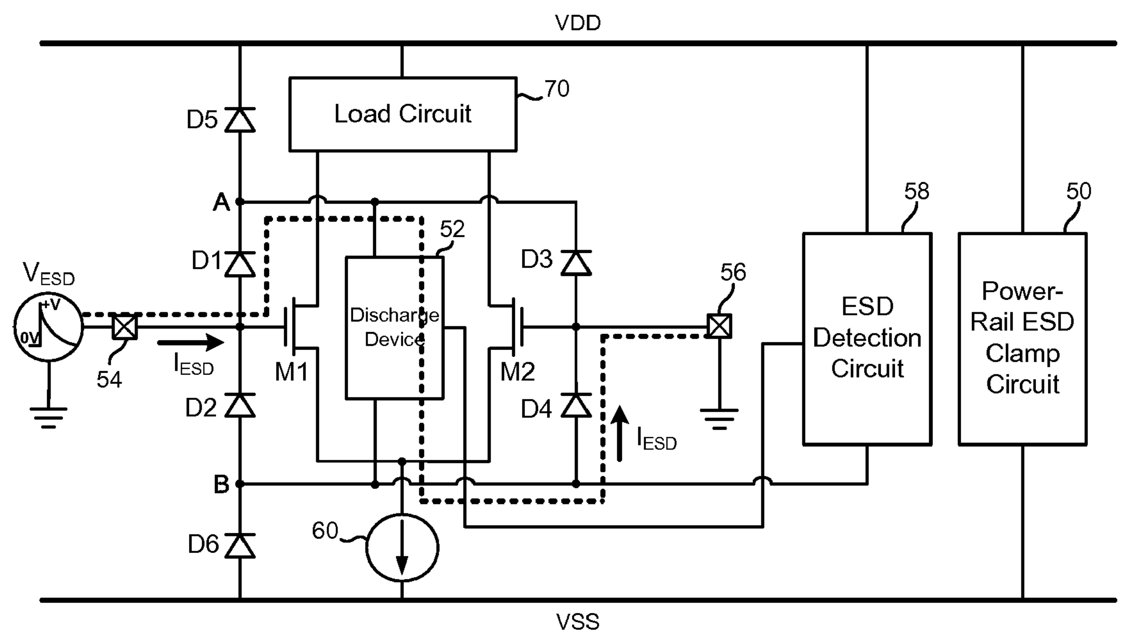

In the embodiment shown in FIG. 8, the negative power end of the ESD detection circuit 58 is connected to node B instead of VSS. Because the voltage at node B must be lower than the voltage at VDD when one of the input pins is zapped by ESD stresses, this change will not affect the normal function of the ESD detection circuit 58.

Figure 9:
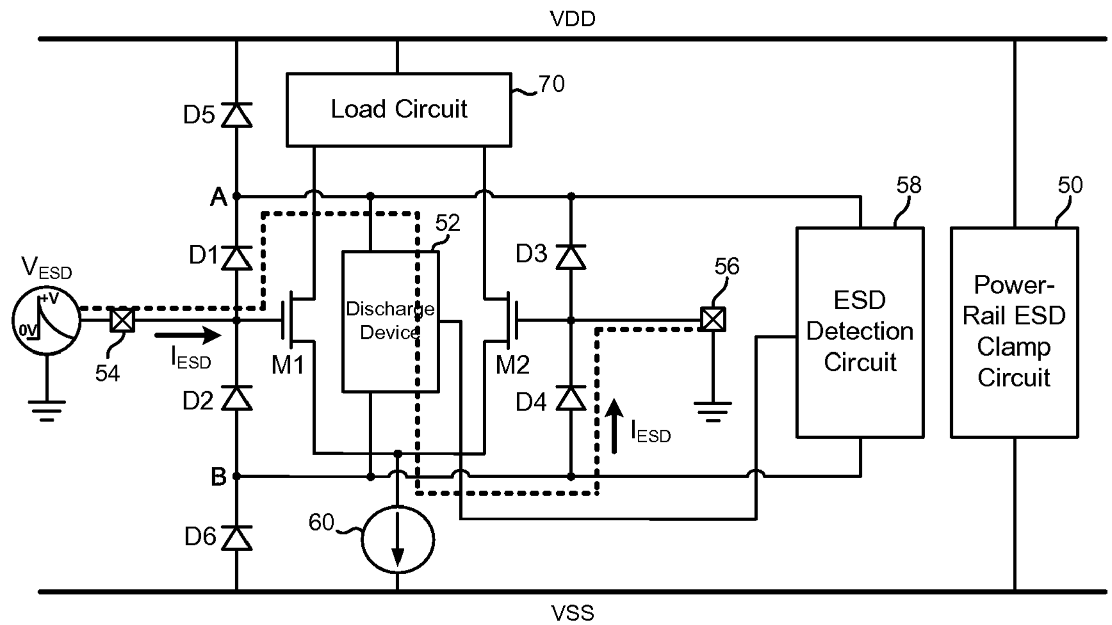
Figure 10:
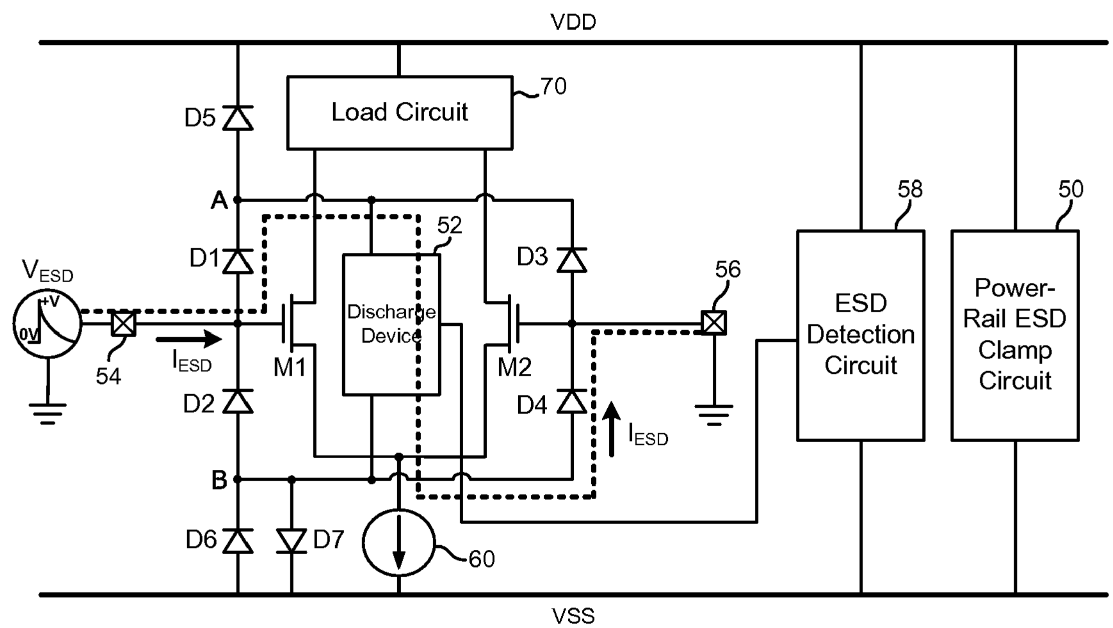

The embodiment shown in FIG. 9 combines the features in FIG. 7 and FIG. 8. More specifically, the positive and negative power ends of the ESD detection circuit 58 are connected to nodes A and B, respectively. As long as the voltage difference between nodes A and B can keep the ESD detection circuit 58 in proper operations when one of the input pins is zapped by ESD stresses (i.e. timely turning on/off the discharge device 52), the configuration shown in FIG. 9 is practicable.

FIG. 10~FIG. 13 depict an exemplary alteration of the circuits in FIG. 5 and FIG. 7~FIG. 9. In these examples, an additional diode D7 is connected between node B and VSS in a forward direction toward VSS. As explained above, when a PS-mode ESD event occurs, ESD currents can flow from the first input pin 54, through the diodes D1, D5, the VDD power line, the ESD clamp circuit 50, and finally to VSS. Under this condition, the ESD detection circuit 58 will also be enabled to turn on the discharge device 52. Therefore, parts of the ESD currents can flow through the diode D1, the discharge device 52, the diode D7, and finally to VSS. In other words, the additional diode D7 in FIG. 10~FIG. 13 can provide an assistant discharging path in a PS-mode ESD event.

FIG. 14~FIG. 17 depict another exemplary alteration of the circuits in FIG. 5 and FIG. 7~FIG. 9. In these examples, an additional diode D7 is connected between node A and VDD in a forward direction toward node A. As explained above, when a ND-mode ESD event occurs, ESD currents will flow from VDD, through the ESD clamp circuit 50, the diodes D6, D2, and finally to the first input pin 54. Under this condition, the ESD detection circuit 58 will also be enabled to turn on the discharge device 52. Therefore, parts of the ESD currents can flow through the diode D7, the discharge device 52, the diode D2, and finally to the first input pin 54. In other words, the additional diode D7 in FIG. 14~FIG. 17 can provide an assistant discharging path in an ND-mode ESD event.

FIG. 18~FIG. 21 depict an exemplary alteration that combines the concepts in FIG. 10~FIG. 13 and FIG. 14~FIG. 17. In these examples, an additional diode D7 is connected between node A and VDD in a forward direction toward node A, and another additional diode D8 is connected between node B and VSS in a forward direction toward VSS. Based on the aforementioned explanations, it can be known that the ESD protection circuits shown in FIG. 18~FIG. 21 are capable of providing effective ESD protections under all ESD conditions.

Figure 11:
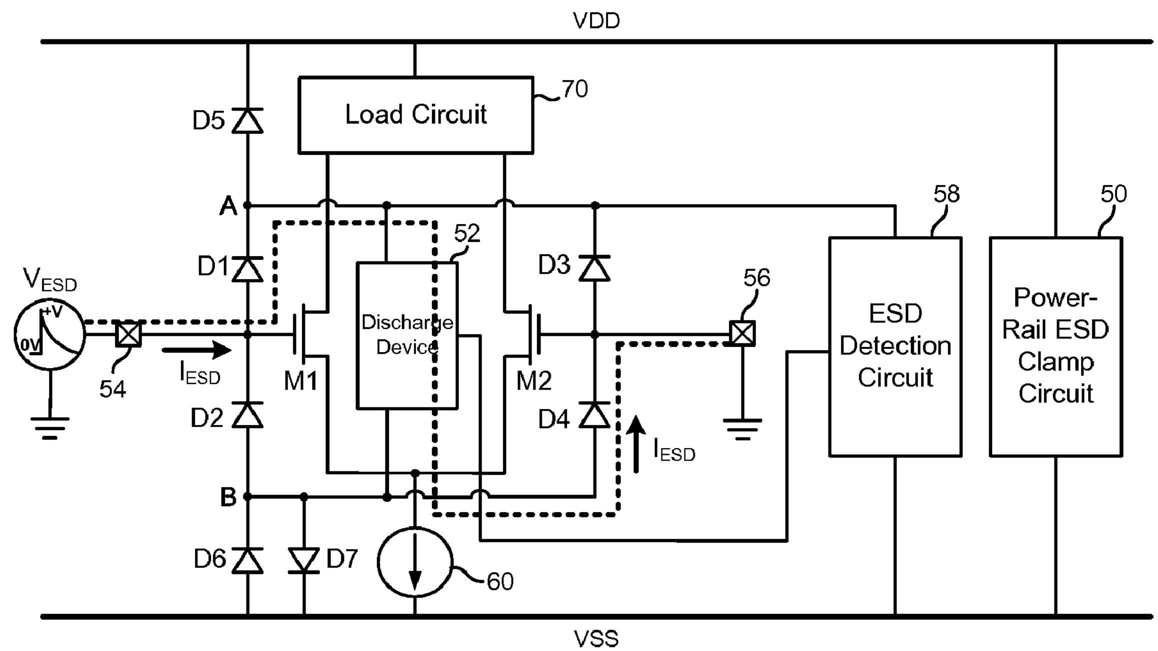
Figure 12:
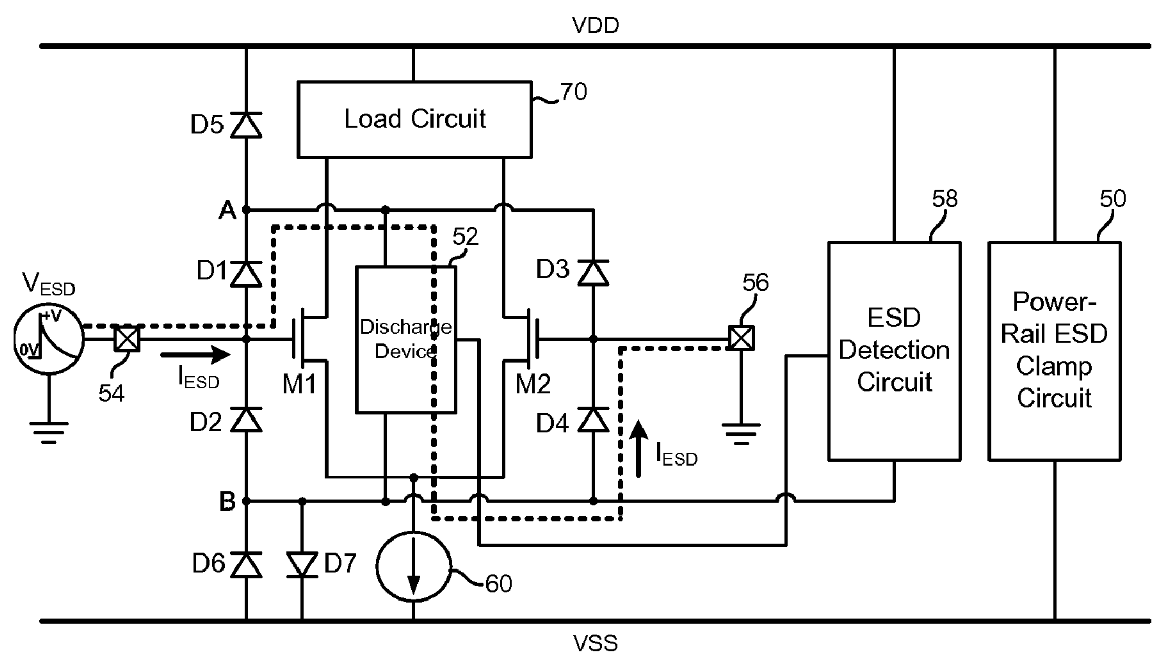
Figure 13:
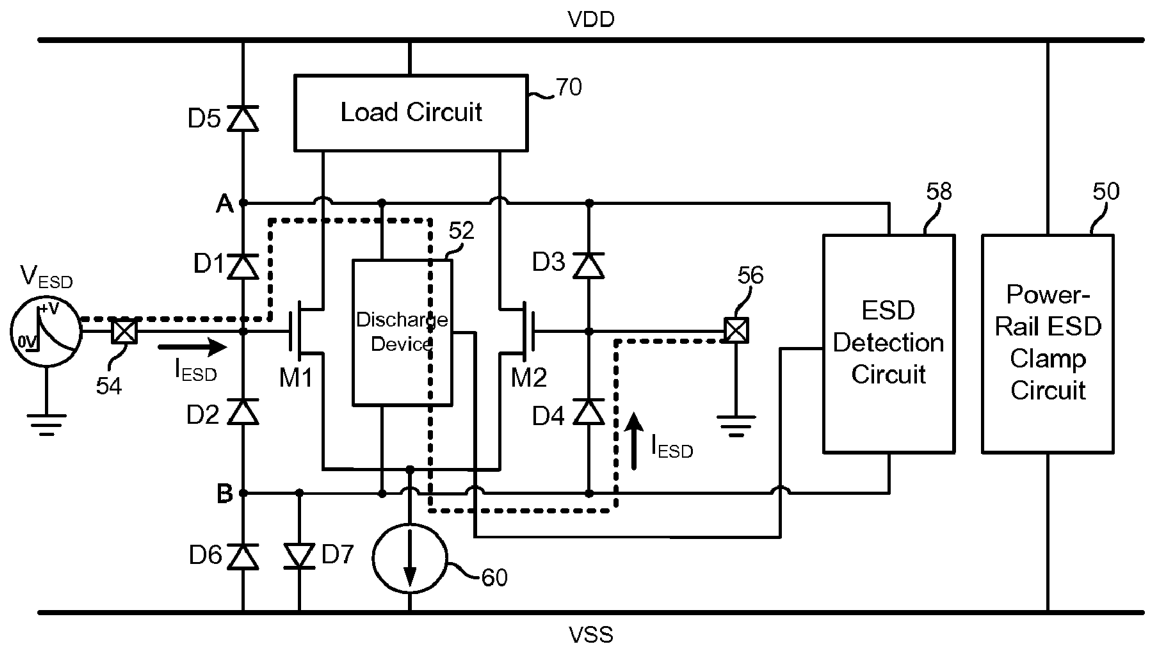
Figure 14:
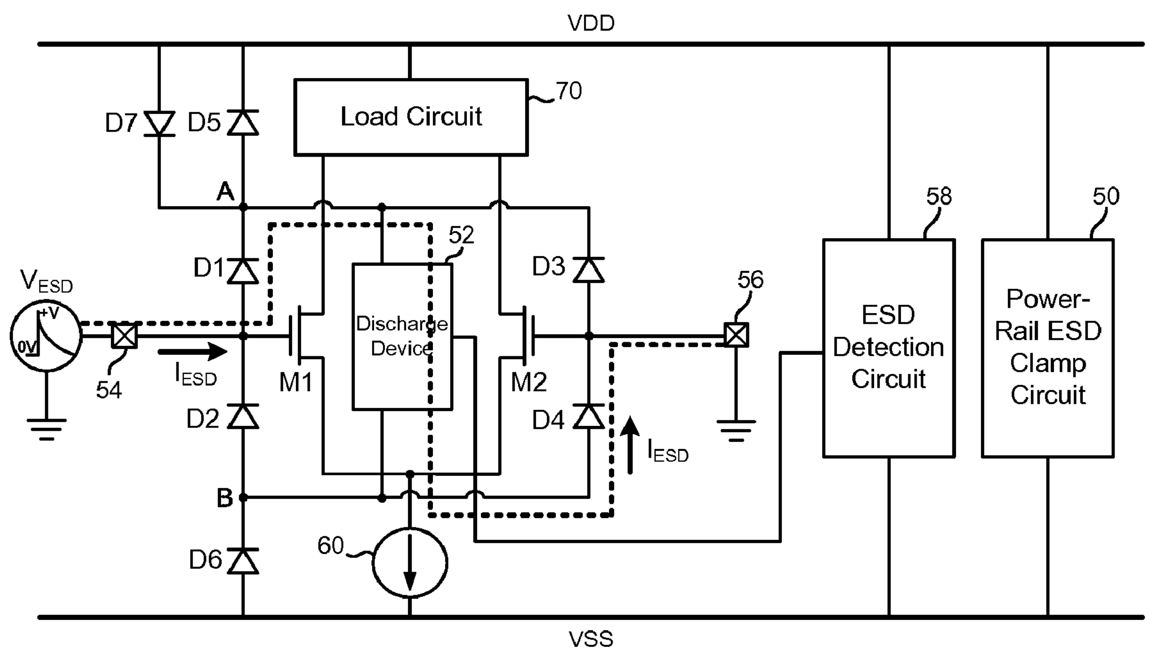
Figure 15:
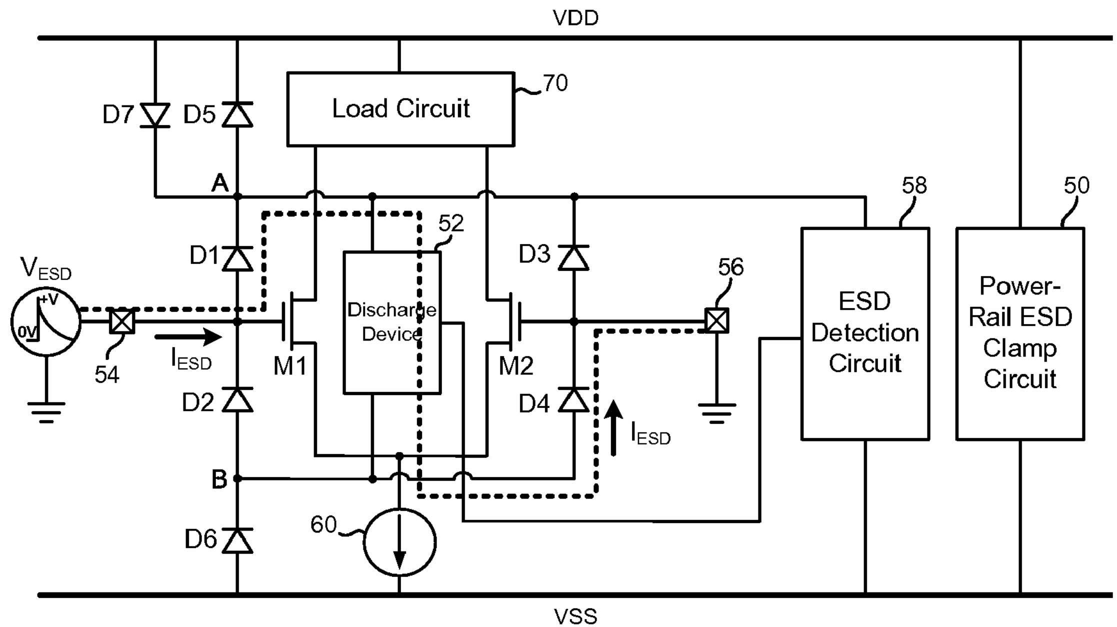

According to the invention, the number and combination of the diodes in the ESD protection circuits can be further altered. Please refer to FIG. 22 and FIG. 23. In these embodiments, the diode labeled as D5 in FIG. 11 and FIG. 13 is removed. Through the diode D1, the positive ESD voltage can be coupled to node A and can still enable the ESD detection circuit 58 to turn on the discharge device 52. Therefore, the function of the whole ESD protection circuit is not affected. Beside, when a PD-mode ESD event occurs, ESD currents will flow from the first input pin 54, through the diode D1, the discharge device 52, the diode D7, VSS, the clamp circuit 50, and finally to VDD. It can be seen that even if the diode D5 between node A and VDD is removed, the circuits in FIG. 22 and FIG. 23 can still provide ESD protection in a PD-mode ESD event.

Figure 16:
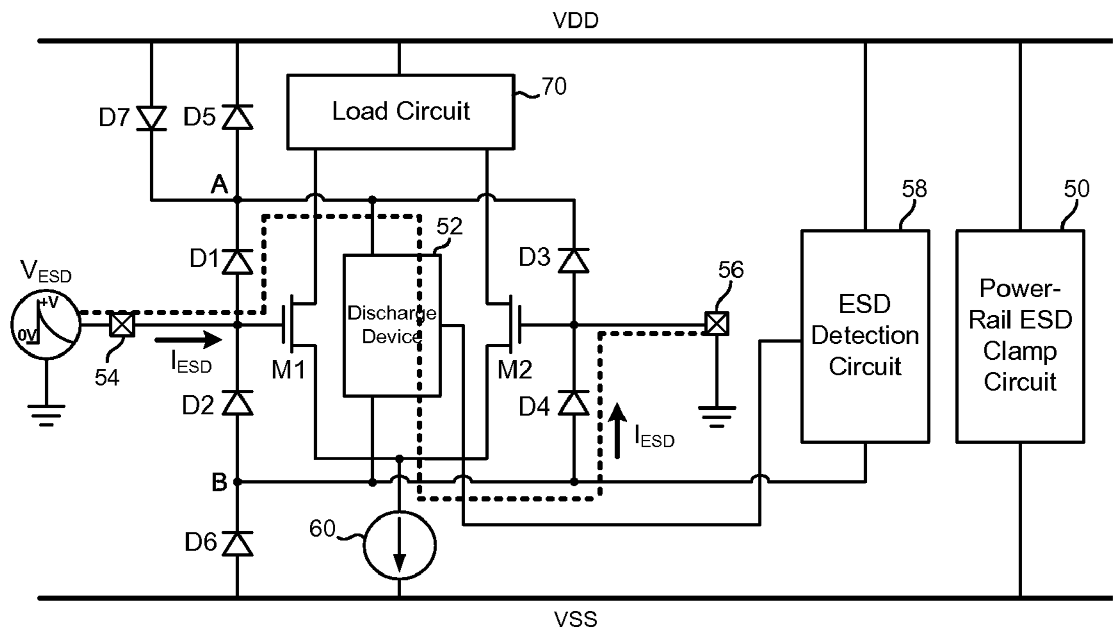
Figure 17:
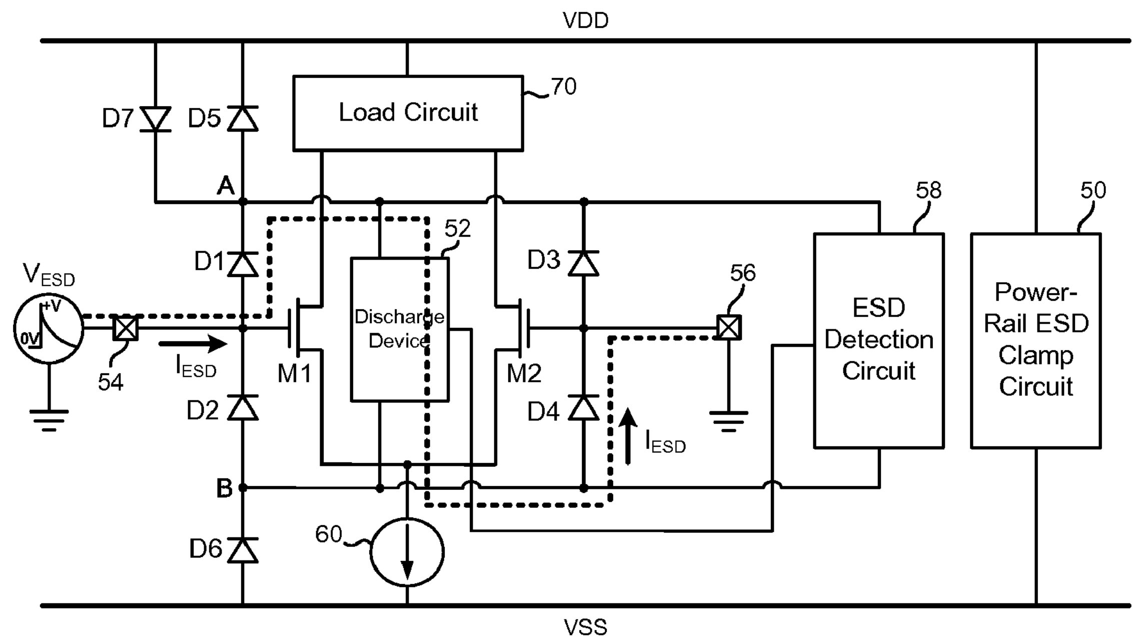
Figure 18:
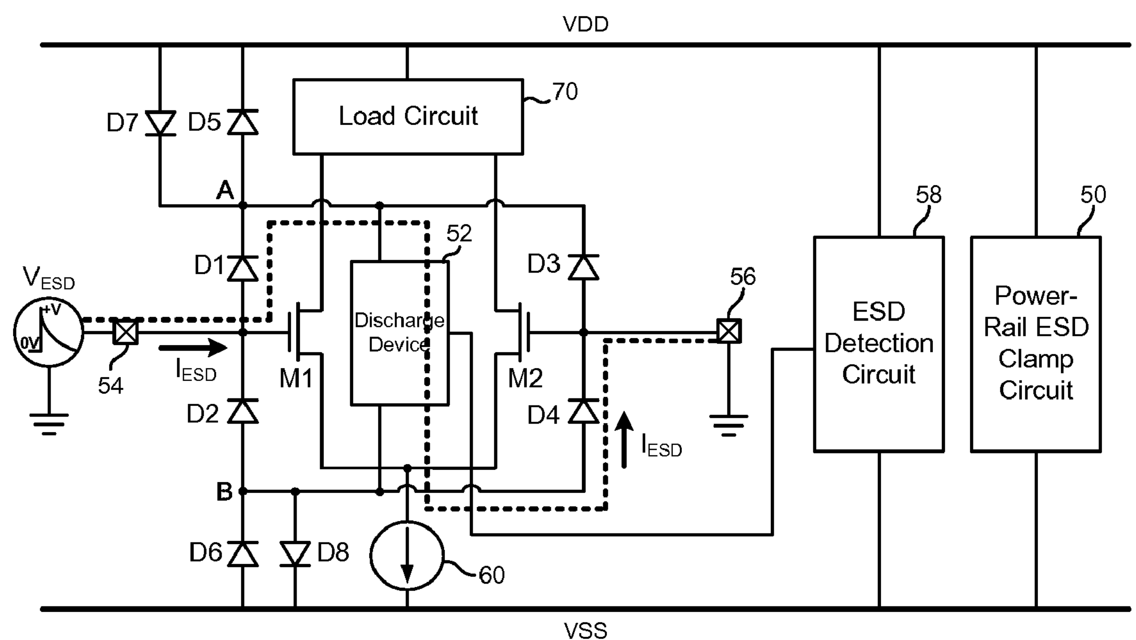
Figure 19:
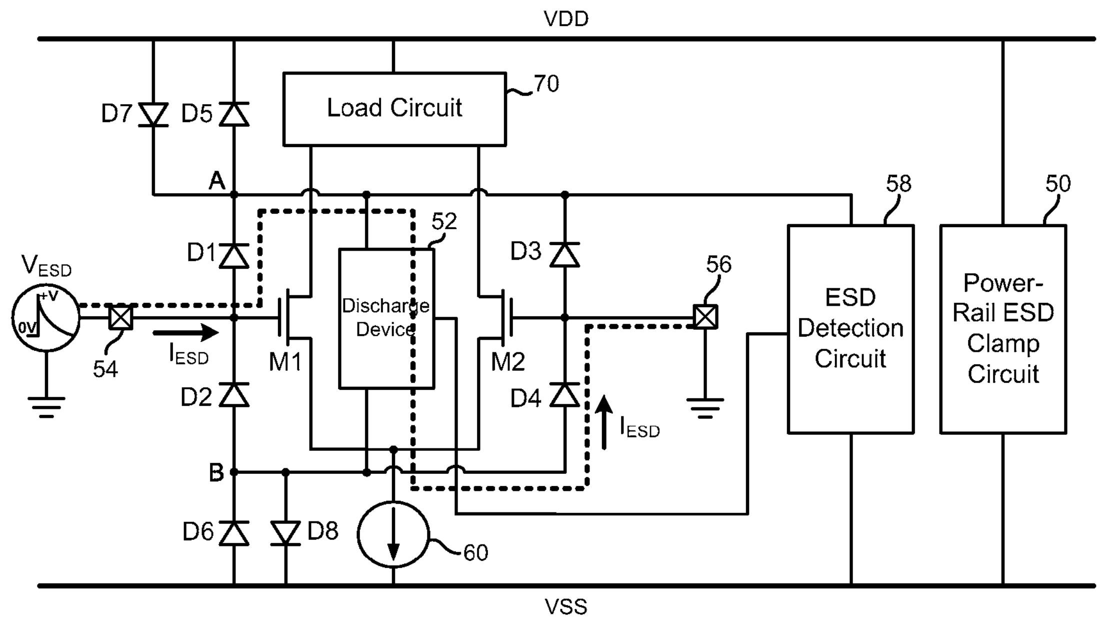
Figure 20:
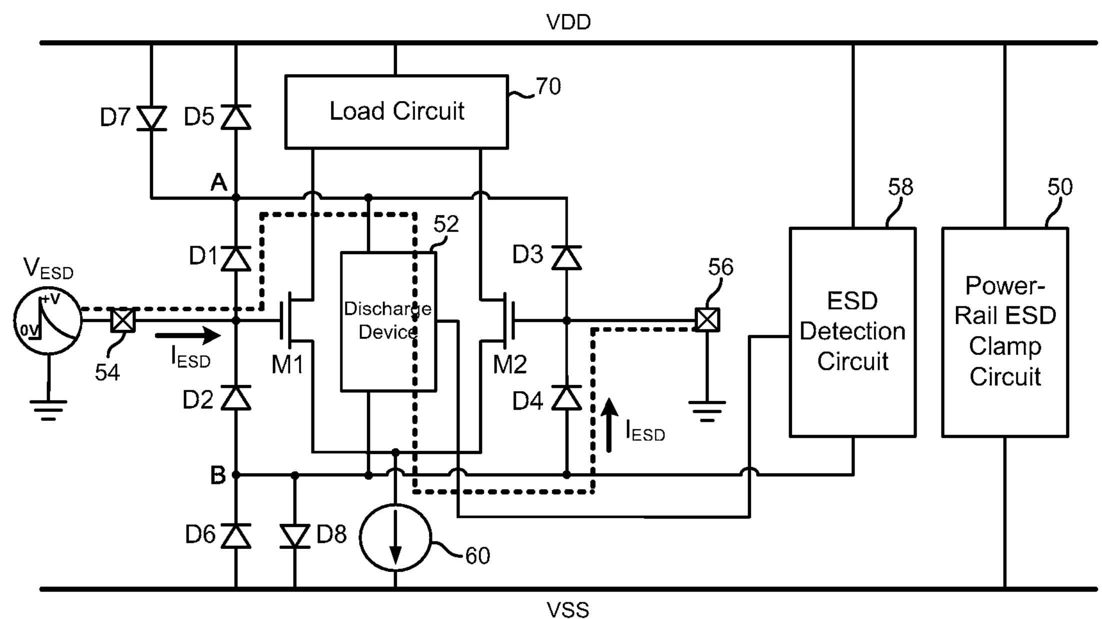
Figure 21:
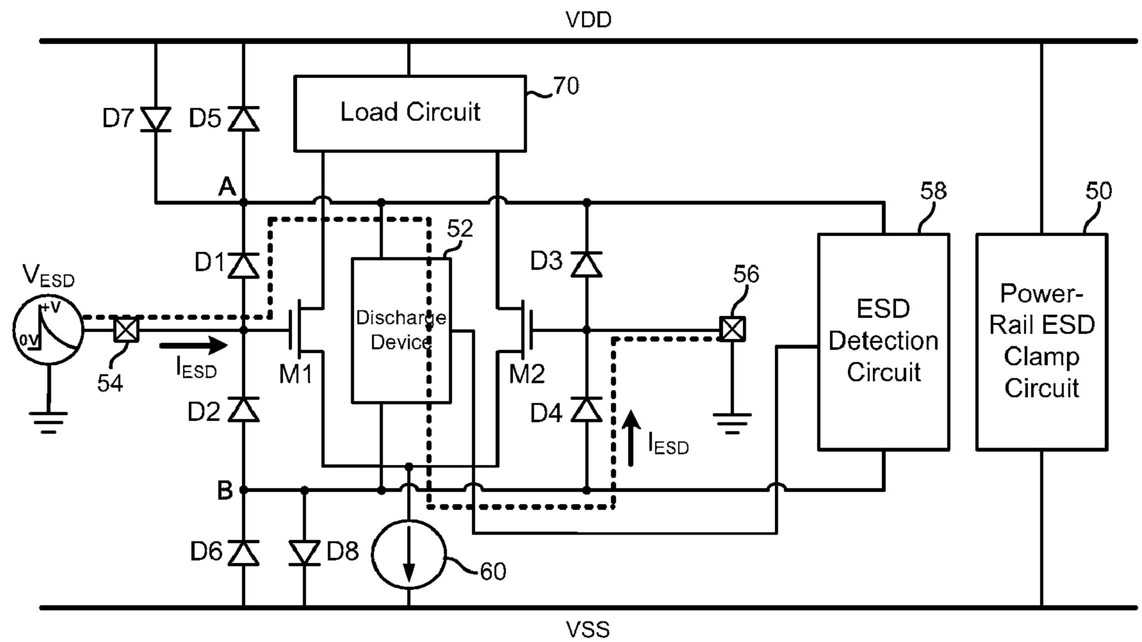
Figure 22:
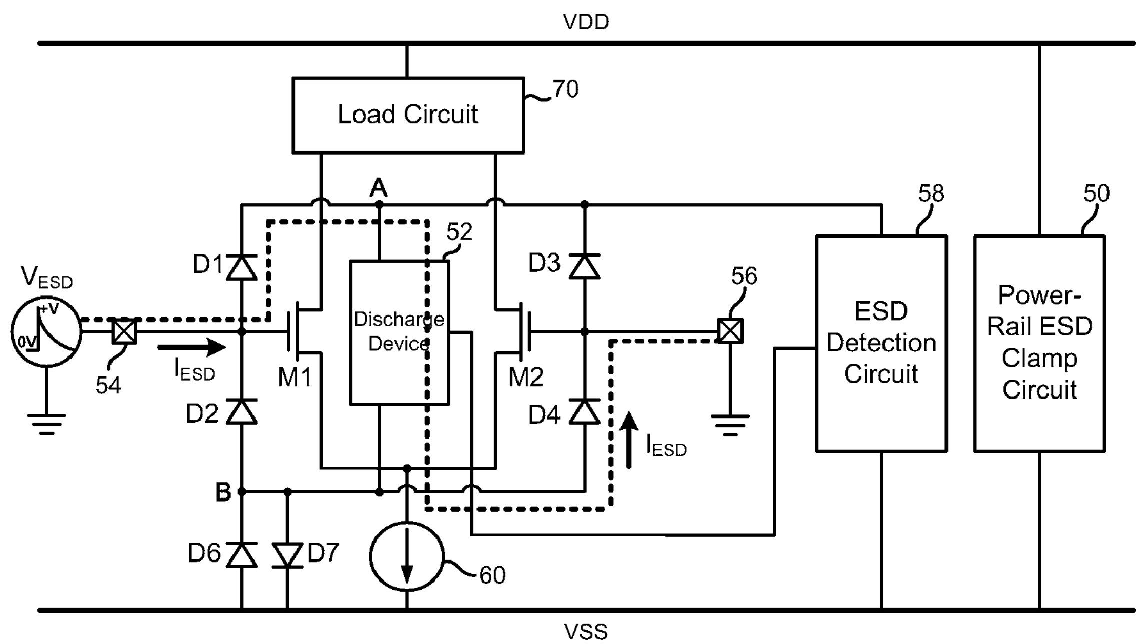
Figure 23:
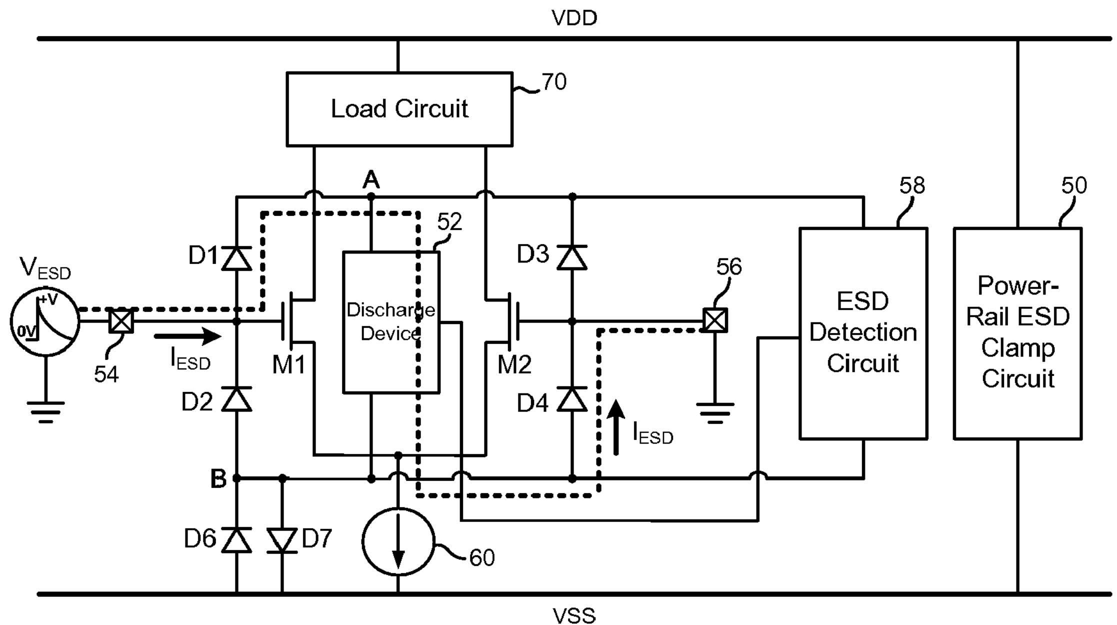
Figure 24:
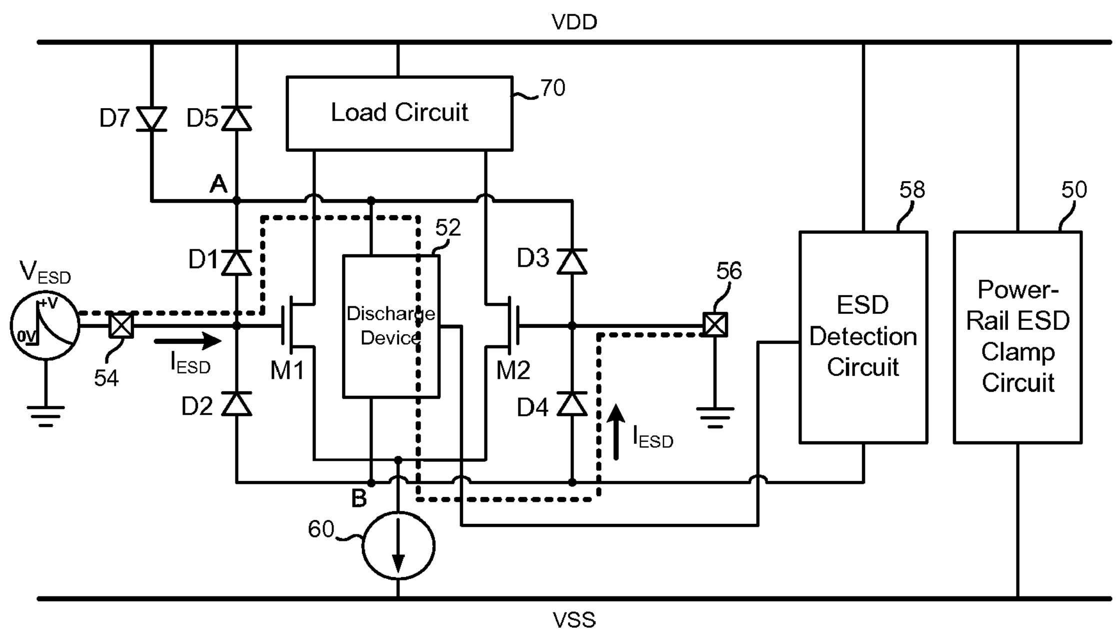
Figure 25:
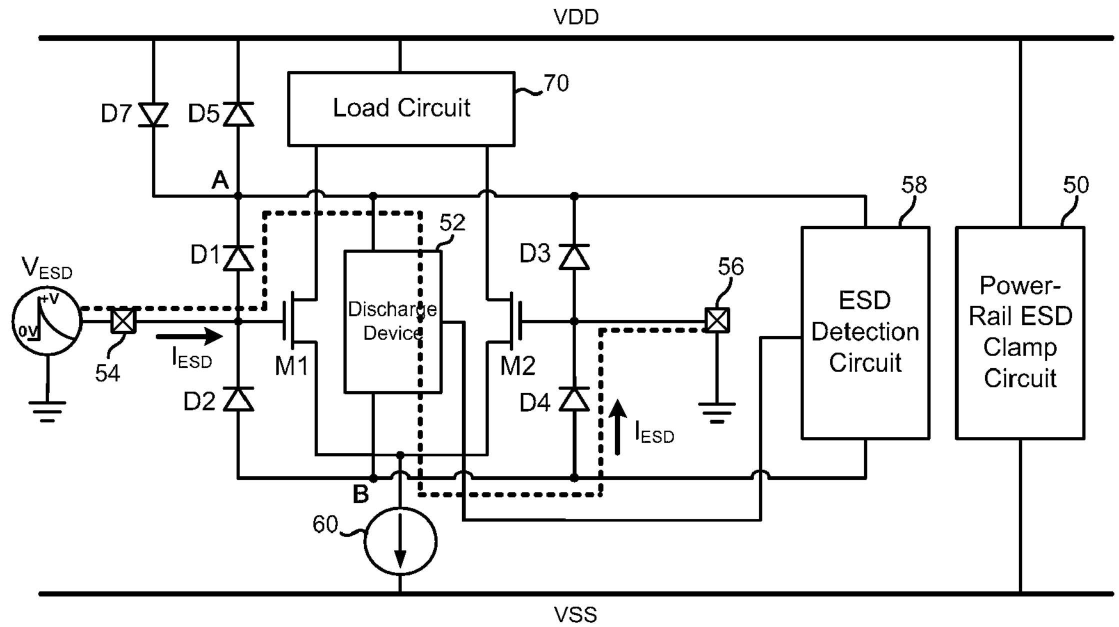

Moreover, as shown in FIG. 24 and FIG. 25, the diode labeled as D6 in FIG. 16 and FIG. 17 can be removed. As depicted above, as long as the voltage difference between the positive and negative power ends of the ESD detection circuit 58 is large enough to keep the ESD detection circuit 58 in proper operations (i.e. timely turning on/off the discharge device 52), the configuration shown in FIG. 24 and FIG. 25 is practicable. Further, when an NS-mode ESD event occurs, ESD currents will flow from the VSS, through the clamp circuit 50, VDD, the diode D7, the discharge device 52, the diode D2, and finally to the first input pin 54. It can be seen that even if the diode between node B and VSS is removed, the circuits in FIG. 24 and FIG. 25 can still provide ESD protection in an NS-mode ESD event.

Figure 26:
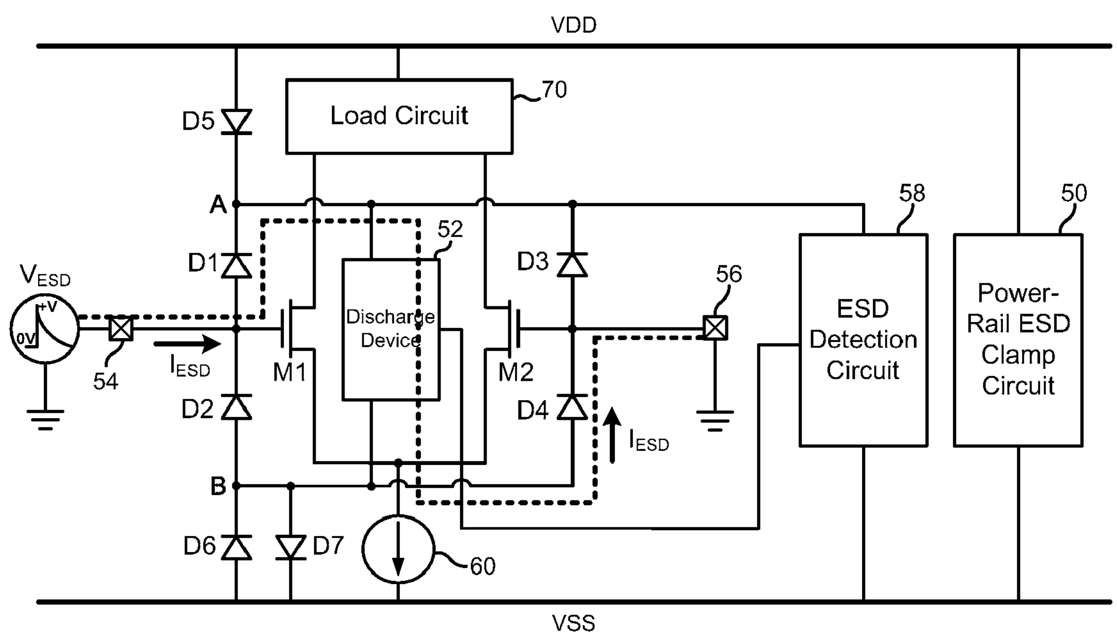
Figure 27:
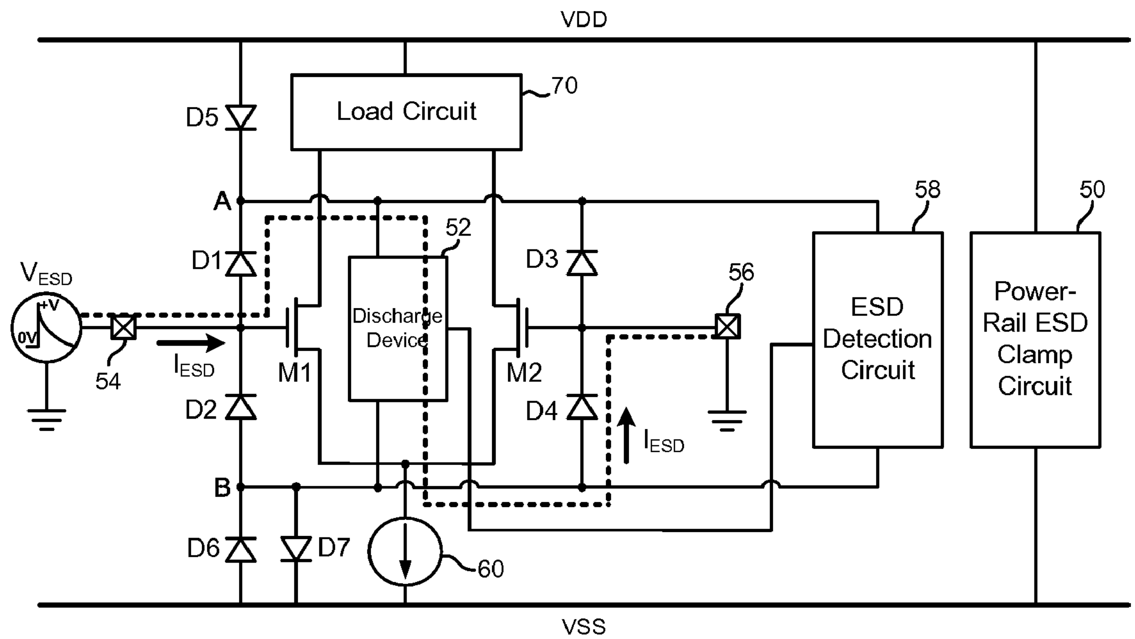

Please refer to FIG. 26 and FIG. 27. In the two embodiments, the forward direction of the diode D5 in FIG. 11 and FIG. 13 is reversed. Through the diode D1, the positive ESD voltage can be coupled to node A and can still enable the ESD detection circuit 58 to turn on the discharge device 52. Therefore, the function of the whole ESD protection circuit is not affected. In an ND-mode ESD event, the diode D5, the discharge device 52, and the diode D2 in FIG. 18 and FIG. 19 can provide an assistant discharge path.

Figure 28:
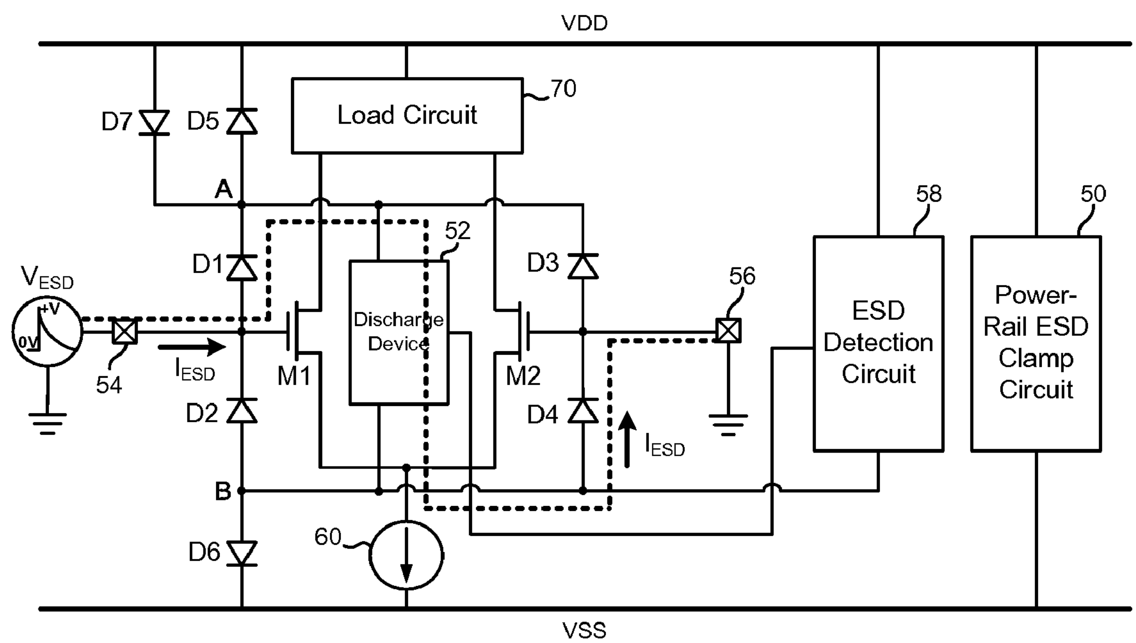
Figure 29:
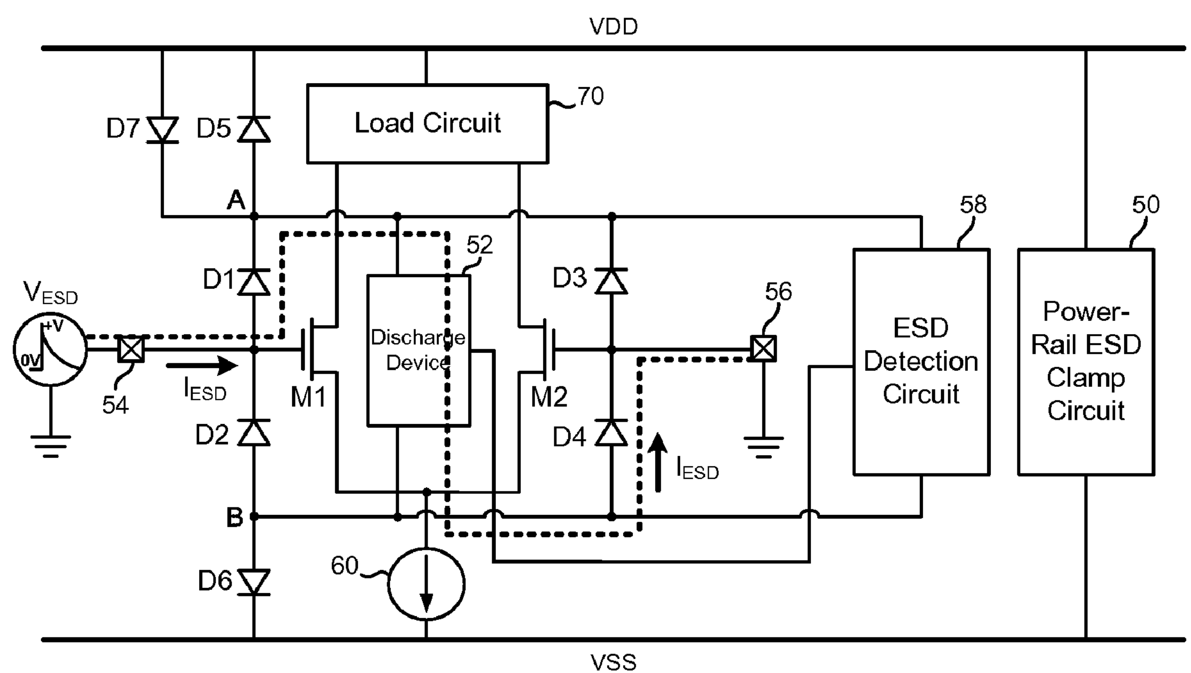

Please refer to FIG. 28 and FIG. 29. In the two embodiments, the forward direction of the diode D6 in FIG. 16 and FIG. 17 is reversed. The two embodiments can also be viewed as alterations of FIG. 24 and FIG. 25 with an additional diode between node B and VSS. Therefore, the function of the whole ESD protection circuit is not affected. Moreover, in a PS-mode ESD event, the diode D1, the discharge device 52, and the diode D6 in FIG. 28 and FIG. 29 can provide an assistant discharge path.

It can be seen that each of the ESD protection circuits in the above embodiments can effectively protect the differential input stage against all ESD modes, including the pin-to-pin ESD mode.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An ESD protection circuit for a differential I/O pair in an IC comprising a first I/O pin and a second I/O pin, the ESD protection circuit comprising:

a discharge device having a first end, a second end, and a triggering end;

a first diode coupled between the first I/O pin and the first end of the discharge device in a forward direction toward the discharge device;

a second diode coupled between the second I/O pin and the second end of the discharge device in a forward direction toward the second I/O pin;

an ESD detection circuit having a positive power end, a negative power end, and an output end; the positive power end being coupled to a positive power line of the IC, the negative power end being coupled to a negative power line of the IC, the output end being coupled to the triggering end of the discharge device; and a third diode coupled between the first end of the discharge device and the positive power line of the IC in a forward direction toward the positive power line;

wherein via the output end, the ESD detection circuit turns the discharge device off during normal power operations and triggers the discharge device during an ESD event.

2. The ESD protection circuit of claim 1, further comprising:

a power-rail clamp unit, coupled between the positive power line and the negative power line of the IC, for conducting an ESD current from the positive power line to the negative power line when a positive ESD stress is formed on the positive power line.

3. The ESD protection circuit of claim 1, further comprising:

a fourth diode coupled between the second I/O pin and the first end of the discharge device in a forward direction toward discharge device; and a fifth diode coupled between the first I/O pin and the second end of the discharge device in a forward direction toward the first I/O pin.

4. The ESD protection circuit of claim 3, further comprising:

a sixth diode coupled between the second end of the discharge device and the negative power line of the IC in a forward direction toward the discharge device.

5. The ESD protection circuit of claim 4, wherein the negative power end of the ESD detection circuit is coupled to the negative power line of the IC through the sixth diode.

6. The ESD protection circuit of claim 4, further comprising:

a seventh diode coupled between the second end of the discharge device and the negative power line of the IC in a forward direction toward the negative power line.

7. The ESD protection circuit of claim 1, wherein the positive power end of the ESD detection circuit is coupled to the positive power line of the IC through the third diode.

8. The ESD protection circuit of claim 1, further comprising:

an eighth diode coupled between the first end of the discharge device and the positive power line of the IC in a forward direction toward the discharge device.

9. The ESD protection circuit of claim 1, further comprising:

a ninth diode coupled between the second end of the discharge device and the negative power line of the IC in a forward direction toward the negative power line; and a tenth diode coupled between the first end of the discharge device and the positive power line of the IC in a forward direction toward the discharge device;

wherein the negative power end of the ESD detection circuit is coupled to the negative power line of the IC through the ninth diode.

10. The ESD protection circuit of claim 9, wherein the positive power end of the ESD detection circuit is coupled to the positive power line of the IC through the third diode.

11. The ESD protection circuit of claim 1, further comprising:

a sixth diode coupled between the second end of the discharge device and the negative power line of the IC in a forward direction toward the discharge device;

a ninth diode coupled between the second end of the discharge device and the negative power line of the IC in a forward direction toward the negative power line; and a tenth diode coupled between the first end of the discharge device and the positive power line of the IC in a forward direction toward the discharge device.

12. The ESD protection circuit of claim 11, wherein the positive power end of the ESD detection circuit is coupled to the positive power line of the IC through the third diode.

13. The ESD protection circuit of claim 11, wherein the negative power end of the ESD detection circuit is coupled to the negative power line of the IC through the sixth diode.

14. The ESD protection circuit of claim 1, wherein the discharge device is a gate-driven NMOS, a gate-driven PMOS, an NPN BJT, a PNP BJT, an NMOS with its gate and source terminals coupled with each other, a PMOS with its gate and source terminals coupled with each other, a P-type substrate-triggered SCR, or an N-type substrate-triggered SCR.

15. An ESD protection circuit for a differential I/O pair in an IC comprising a first I/O pin and a second I/O pin, the ESD protection circuit comprising:

a discharge device having a first end, a second end, and a triggering end;

a first diode coupled between the first I/O pin and the first end of the discharge device in a forward direction toward the discharge device;

a second diode coupled between the second I/O pin and the second end of the discharge device in a forward direction toward the second I/O pin;

a third diode coupled between the second I/O pin and the first end of the discharge device in a forward direction toward discharge device;

a fourth diode coupled between the first I/O pin and the second end of the discharge device in a forward direction toward the first I/O pin;

an ESD detection circuit having a positive power end, a negative power end, and an output end; the positive power end being coupled to the first end of the discharge device, the negative power end being coupled to a negative power line of the IC, the output end being coupled to the triggering end of the discharge device;

a fifth diode coupled between the second end of the discharge device and the negative power line of the IC in a forward direction toward the discharge device; and a sixth diode coupled between the second end of the discharge device and the negative power line of the IC in a forward direction toward the negative power line;

wherein via the output end, the ESD detection circuit turns the discharge device off during normal power operations and triggers the discharge device during an ESD event.

16. The ESD protection circuit of claim 15, wherein the negative power end of the ESD detection circuit is coupled to the negative power line of the IC through the sixth diode.

17. An ESD protection circuit for a differential I/O pair in an IC comprising a first I/O pin and a second I/O pin, the ESD protection circuit comprising:

a discharge device having a first end, a second end, and a triggering end;

a first diode coupled between the first I/O pin and the first end of the discharge device in a forward direction toward the discharge device;

a second diode coupled between the second I/O pin and the second end of the discharge device in a forward direction toward the second I/O pin;

a third diode coupled between the second I/O pin and the first end of the discharge device in a forward direction toward discharge device;

a fourth diode coupled between the first I/O pin and the second end of the discharge device in a forward direction toward the first I/O pin;

an ESD detection circuit having a positive power end, a negative power end, and an output end; the positive power end being coupled to a positive power line of the IC, the negative power end being coupled to the second of the discharge device, the output end being coupled to the triggering end of the discharge device;

a fifth diode coupled between the first end of the discharge device and the positive power line of the IC in a forward direction toward the positive power line; and a sixth diode coupled between the first end of the discharge device and the positive power line of the IC in a forward direction toward the discharge device;

wherein via the output end, the ESD detection circuit turns the discharge device off during normal power operations and triggers the discharge device during an ESD event.

18. The ESD protection circuit of claim 17, wherein the positive power end of the ESD detection circuit is coupled to the positive power line of the IC through the fifth diode.

19. An ESD protection circuit for a differential I/O pair in an IC comprising a first I/O pin and a second I/O pin, the ESD protection circuit comprising:

a discharge device having a first end, a second end, and a triggering end;

a first diode coupled between the first I/O pin and the first end of the discharge device in a forward direction toward the discharge device;

a second diode coupled between the second I/O pin and the second end of the discharge device in a forward direction toward the second I/O pin;

a third diode coupled between the second I/O pin and the first end of the discharge device in a forward direction toward discharge device;

a fourth diode coupled between the first I/O pin and the second end of the discharge device in a forward direction toward the first I/O pin;

an ESD detection circuit having a positive power end, a negative power end, and an output end; the positive power end being coupled to the first end of the discharge device, the negative power end being coupled to a negative power line of the IC, the output end being coupled to the triggering end of the discharge device;

a fifth diode coupled between the first end of the discharge device and the positive power line of the IC in a forward direction toward the discharge device;

a sixth diode coupled between the second end of the discharge device and the negative power line of the IC in a forward direction toward the discharge device; and a seventh diode coupled between the second end of the discharge device and the negative power line of the IC in a forward direction toward the negative power line;

wherein via the output end, the ESD detection circuit turns the discharge device off during normal power operations and triggers the discharge device during an ESD event.

20. The ESD protection circuit of claim 19, wherein the negative power end of the ESD detection circuit is coupled to the negative power line of the IC through the seventh diode.

* * * * *